United States Patent [19]

Pasch

[11] Patent Number: 4,631,248
[45] Date of Patent: Dec. 23, 1986

[54] METHOD FOR FORMING AN ELECTRICAL CONTACT IN AN INTEGRATED CIRCUIT

[75] Inventor: Nicholas Pasch, Mt. View, Calif.

[73] Assignee: LSI Logic Corporation, Milpitas, Calif.

[21] Appl. No.: 747,474

[22] Filed: Jun. 21, 1985

[51] Int. Cl.[4] .............................................. B44C 1/22
[52] U.S. Cl. .................................... 430/313; 430/316; 430/317; 430/323; 156/643; 156/651; 156/653
[58] Field of Search ..................... 156/643, 651, , 653; 430/313, 316, 317, 323

[56] References Cited

U.S. PATENT DOCUMENTS 4,484,979 11/1984 Stocker ............................... 156/643
4,522,681 6/1985 Gorowitz et al. ................... 156/643

FOREIGN PATENT DOCUMENTS 0021271 2/1979 Japan ................................... 430/313
0114331 9/1981 Japan ................................... 156/653

OTHER PUBLICATIONS

IBM Tech Disclosure Bulletin, vol. 23, No. 12, May 1981, Elimination of Reactive Ion Etching, Trench Induced Defects, Dau et al.
IBM Tech Disclosure Bulletin, vol. 19, No. 11, Apr., 1977, Clark Reactive Ion-Etch Process for Etched Sidewall Tailoring.
IBM Tech Disclosure Bulletin, vol. 21, No. 8, Jan. 1979, Silicon Grooves-Bottom Geometry Control, Burkhardt et al.

Primary Examiner—John E. Kittle
Assistant Examiner—Patrick J. Ryan
Attorney, Agent, or Firm—Steven F. Caserza; Kenneth E. Leeds; Alan H. MacPherson

[57] ABSTRACT

A contact (15) formed in accordance with the present invention includes rounded corners on the upper and lower surface and sloped walls in the dielectric material (10) in which the contact is formed. In one embodiment, a photolithographic mask is formed above the dielectric material (10) using photolithographic techniques well known in the art. Using reactive ion etching techniques, the contact is etched until a small portion of the dielectric material remains to be etched in the contact. The photolithographic mask is then removed. The contact is then completely etched using a reactive ion etching process. Using this technique, the contact formed has rounded upper edges.

16 Claims, 13 Drawing Figures

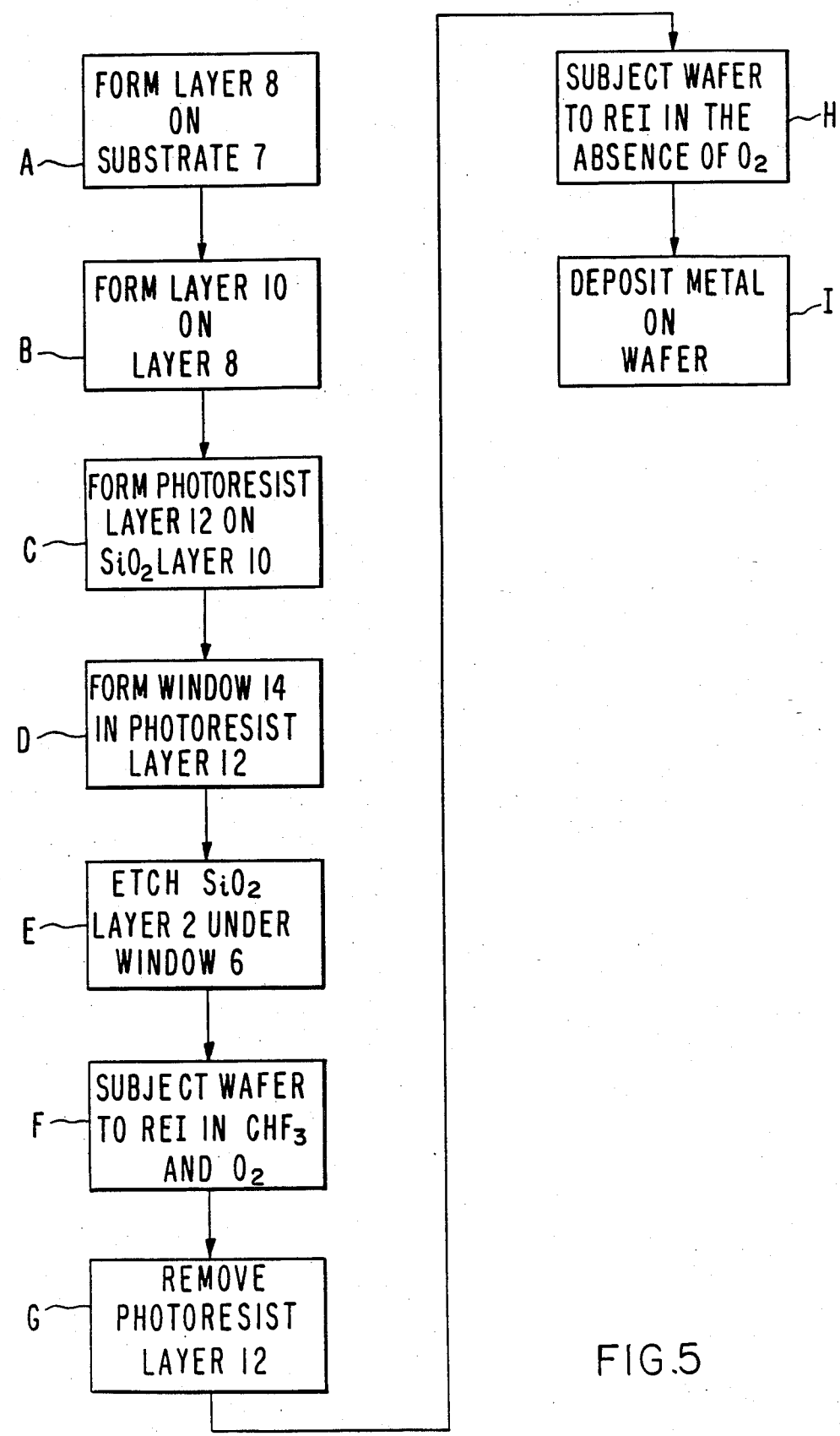

METHOD FOR FORMING AN ELECTRICAL CONTACT IN AN INTEGRATED CIRCUIT

BACKGROUND OF THE INVENTION

This invention relates to integrated circuit fabrication, and more specifically to the formation of electrical contacts and vias through insulating dielectric layers.

Integrated circuits typically include a silicon substrate covered by a dielectric insulating layer such as silicon dioxide. On top of the silicon dioxide are conductive traces. At selected areas, holes are formed in the silicon dioxide and the conductive traces are permitted to make electrical contact with devices (e.g., transistors, diodes and resistors) formed within the silicon substrate. A contact during various stages of a prior art fabrication process is illustrated in FIGS. 1a through 1e. (As used in this patent, the term "contact" means a hole in an insulating material which permits an electrically conductive material to be electrically connected to a semiconductor substrate.) FIG. 1a illustrates a cross section of a silicon wafer 1 coated with a silicon dioxide layer 2. Silicon dioxide layer 2 is provided through any of a variety of means such as chemical vapor deposition (CVD) or thermal oxidation. Above silicon dioxide layer 2 is a photoresist layer 3. Photoresist layer 3 is then selectively exposed to light, and the portions of photoresist layer 3 exposed to light are then removed, thereby forming a window 4 in photoresist layer 3, as shown in FIG. 1b.

After forming window 4 in photoresist layer 3, the wafer is then subjected to a reactive ion etch (RIE) process. This process is typically accomplished at a pressure of approximately 20 to 80 millitorr using a gas mixture which is approximately 30 to 40% oxygen and 70 to 60% CHF$_3$ and a power in the range of 1000 to 1200 watts. The RIE process attacks both photoresist layer 3 and silicon dioxide layer 2. This continues until a profile such as the one illustrated in FIG. 1c is achieved, at which time the oxygen is substantially removed from the plasma and the RIE process is continued until the profile illustrated in FIG. 1d is achieved. (As is explained below, the oxygen is removed to prevent etching of silicon wafer 1.) Thereafter, photoresist layer 3 is removed and, as shown in FIG. 1e, metal layer 5 is deposited upon silicon wafer 1 using any of a variety of known processes, e.g. sputtering.

When using a reactive ion etch in the presence of significant amounts of oxygen, edge 3a (FIG. 1c) of photoresist layer 3 is eroded back. Because of this, when using an RIE process in the presence of oxygen, at the above-mentioned power and pressure, the walls 4a and 4b of window 4 are gently sloped. However, when using an RIE process with little oxygen (i.e., less than 10% oxygen) present, edge 3a of photoresist layer 3 is not eroded back. Further, when forming a contact in silicon dioxide layer 2 using an RIE process, the etching is highly anisotropic, etching preferentially in specific directions (i.e., downward) into the substance being etched. In contrast, an isotropic etchant etches in all directions without directional preference. Because the RIE process etches preferentially in a downward direction, walls 2a and 2b of silicon dioxide layer 2 in FIG. 1d are very close to vertical.

The structure illustrated in FIG. 1e exhibits several problems. The electrical connection between portions 5a and 5b of metal layer 5 is extremely thin at corners 5c because of the shadowing caused by wall 2b of silicon dioxide layer 2. In addition, metal layer 5 is also thin at corner 5d because of sharp edge 2d of silicon dioxide layer 2. Because metal layer 5 is so thin at corners 5c and 5d, several problems are known to result. For example, the metal at corners 5c and 5d can act as a fuse when a large current passes through them, thereby creating an open circuit between portion 5a and portion 5b. Furthermore, the metal at corners 5c and 5d can be further weakened and broken due to the effects of corrosion, electron migration, and thermal stress, thus causing a failure. This type of failure may occur some time after fabrication, for example after the device has been included in a larger structure that has been placed into active use.

Although using a reactive ion etch in an oxygen-CHF$_3$ mixture having a high percentage of oxygen (e.g., greater than 35%) produces sloped walls in silicon dioxide layer 2 (because edge 3a erodes), as the bottom of window 4 approaches layer of silicon substrate 1, it is necessary to reduce the oxygen concentration during the RIE process. This is because a reactive ion etch using a high concentration of CHF$_3$ will not attack silicon substrate 1 but a reactive ion etch including significant amounts of oxygen will attack silicon substrate 1 rapidly. If an RIE process including oxygen were used past the point at which the profile illustrated in FIG. 1c is achieved, a profile such as the one illustrated in FIG. 2 would result. This profile is utterly unacceptable, since it is extremely difficult to deposit metal layer 5 into window 4 while being able to maintain electrical contact across corner points 6a and 6b. In addition, regions in substrate 1 would be destroyed, potentially destroying devices formed therein.

It is not known how to employ those qualities of an oxygen rich CHF$_3$ RIE process that cause desirable erosion of photoresist edge 3a and therefore the gently sloped silicon dioxide contact edge 2b without encountering excessive damage to the underlying silicon. Similarly, it is not currently known how to employ those qualities of an oxygen deficient CHF$_3$ RIE process that cause the etching process to leave exposed silicon essentially undamaged and yet erode the photoresist (and hence etch vertical walls in the silicon dioxode).

SUMMARY

A contact formed in accordance with the teachings of the present invention includes rounded corners on the upper and lower surfaces of the dielectric material containing the contact. In one embodiment of this invention, a mask is formed on the surface of the dielectric material and patterned using photolithographic techniques well known in the art. Using an RIE process with a process gas including CHF$_3$ and significant amounts of O$_2$, the contact is etched until a small portion of the dielectric material remains in the contact opening. The photolithographic mask is then completely removed. The contact opening is then completely formed using an RIE process without oxygen. Using this technique, the contact opening formed has rounded upper edges and rounded lower corners.

BRIEF DESCRIPTION OF THE DRAWING

FIG. 5 is a flow chart of the method in accordance with the present invention.

DETAILED DESCRIPTION

Figure 1A:
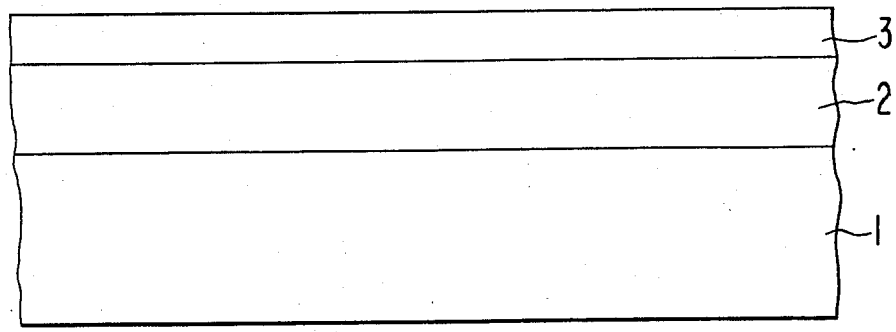
FIGS. 1a through 1e are cross-sectional drawings of an electrical contact in an integrated circuit during various stages of a prior art method for manufacturing the contact.
Figure 1B:
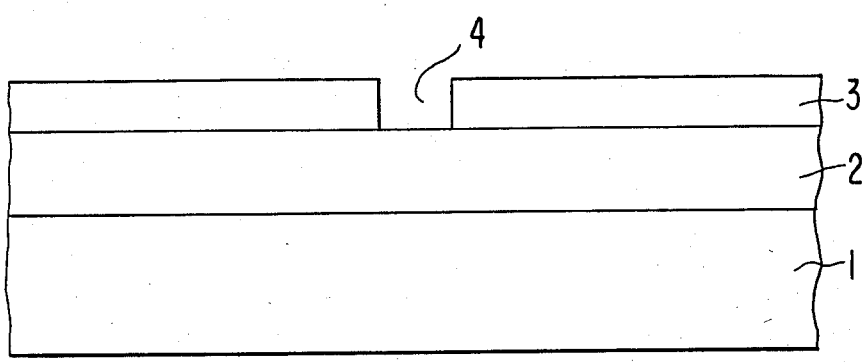
Figure 1C:
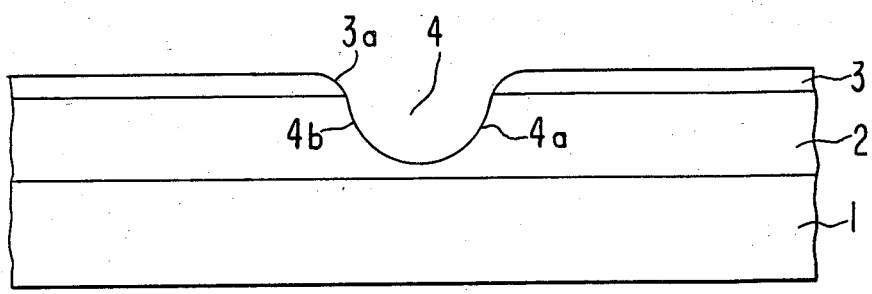
Figure 1D:
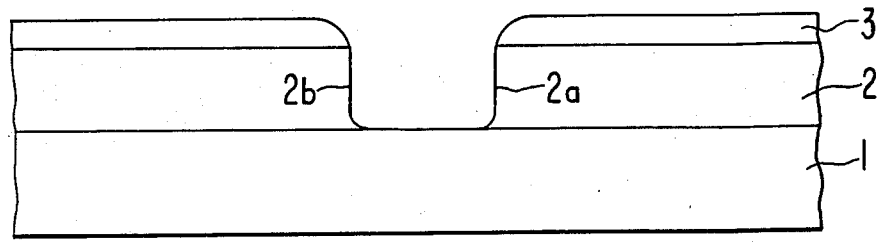
Figure 1E:
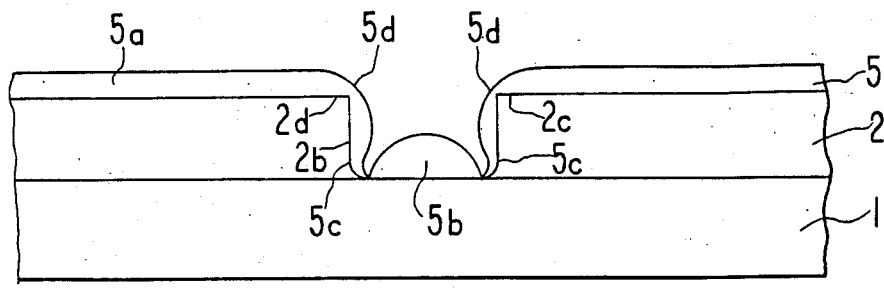
Figure 2:
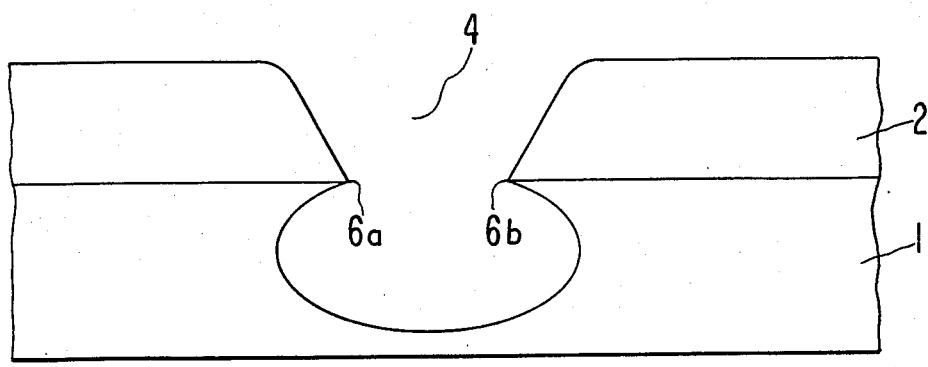
FIG. 2 is a cross-sectional drawing of a contact etched in a high percentage oxygen $O_2$-$CHF_3$ RIE process for an excessive period of time.
Figure 3A:
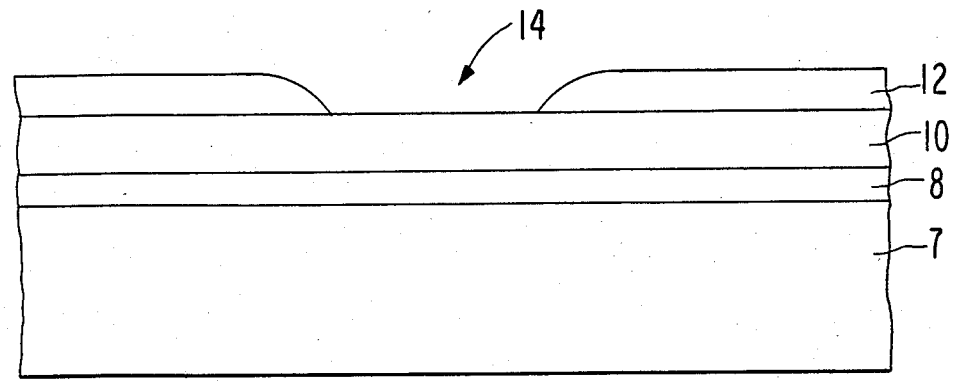
FIGS. 3a through 3e are cross-sectional diagrams illustrating the steps of the present invention.

FIGS. 3a through 3e are cross-sectional drawings which illustrate a method of forming an electrical contact opening according to the teachings of the present invention. The steps of the present invention are listed in the flow diagram at FIG. 5. Substrate 7 (FIG. 3a) is an N type silicon substrate having a conductivity in the range of approximately 0.01 to 30 ohm centimeters, but a silicon substrate having any resistivity could be used. In addition, substrates made from materials other than silicon can be used. A first silicon dioxide ($SiO_2$) layer 8 of FIG. 3a is formed to a thickness of approximately 3500 Å, for example by CVD deposition or thermal oxidation as is well known in the art. (Step A of FIG. 5). Second silicon dioxide layer 10 is formed on silicon dioxide layer 8 to a thickness of approximately 6500 Å by a CVD process, and contains a 6% molar concentration of boron and a 6% molar concentration of phosphorus dopants. (Step B of FIG. 5). As is known in the art, silicon dioxide doped with boron and phosphorus has a lower flow temperature than undoped silicon dioxide. (The flow temperature of silicon dioxide is the temperature at which silicon dioxide starts to melt and assume a curved profile.) Accordingly, doped silicon dioxide layer 10 is provided if during a subsequent step it is desired to cause silicon dioxide layer 10 to flow at a temperature lower than the flow temperature of undoped $SiO_2$. $SiO_2$ layer 8 is undoped because $SiO_2$ doped with boron and phosphorus can have an undesirable effect on the electrical properties of silicon substrate 7 if the dopants diffuse from the $SiO_2$ into silicon substrate 7. Thus, layer 8 is a buffer layer. However, in accordance with the present invention, silicon dioxide layers 8 and 10 could both be doped with boron and phosphorus or could both be undoped. In addition, $SiO_2$ layers 8 and 10 could be replaced with a single doped or undoped layer of silicon dioxide.

Photoresist layer 12 is formed on silicon dioxide layer 10 using techniques well known in the art. (Step C of FIG. 5.) Photoresist layer 12 is then patterned to form window 14 where a contact is to be formed. (Step D of FIG. 5.) In one embodiment of the invention, photoresist layer 12 is then heated, e.g. by baking at approximately 200° C. for approximately thirty minutes causing it to flow, forming a curved profile as illustrated in FIG. 3a. This is done because, as will become more apparent from the discussion below, the profile of photoresist layer 12 affects the shape of the walls of the subsequently formed contact. Specifically, the profile of photoresist layer 12 affects the speed with which the wall of photoresist layer 12 is pushed back, thereby exposing $SiO_2$ layer 10 to the RIE process.

Figure 3B:
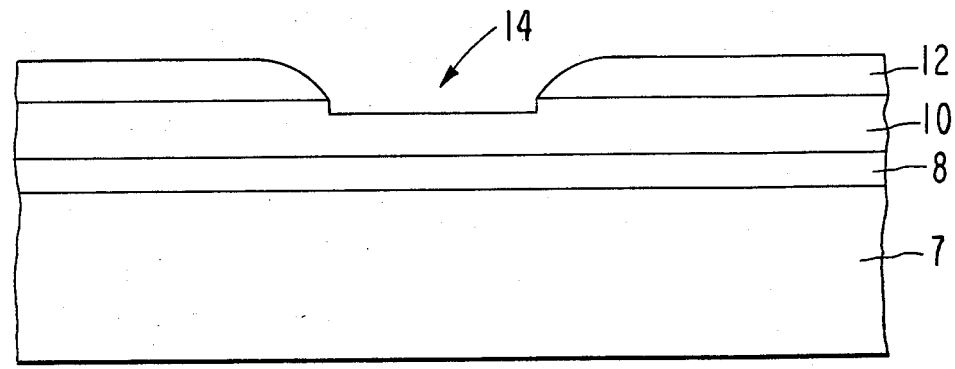

As shown in FIG. 3b, a portion of silicon dioxide layer 10 is removed using an etching process which selectively etches silicon dioxide layer 10 while not affecting photoresist layer 12. One such etching process uses a plasma composed of 90 cubic centimeters per minute (cc/min) $CHF_3$ and 10 cc/min $O_2$. The exposed portion of silicon dioxide layer 10 is etched during this step to a depth of approximately 2500 Å in an RIE process. (Step E of FIG. 5.) This makes silicon dioxide layer 10 thinner where the contact is to be formed but not where it is desired to retain silicon dioxide layer 10. The reason for this will become more apparent as explained below. In other embodiments of the invention, step E is performed using etching processes other than reactive ion etching.

Figure 3C:
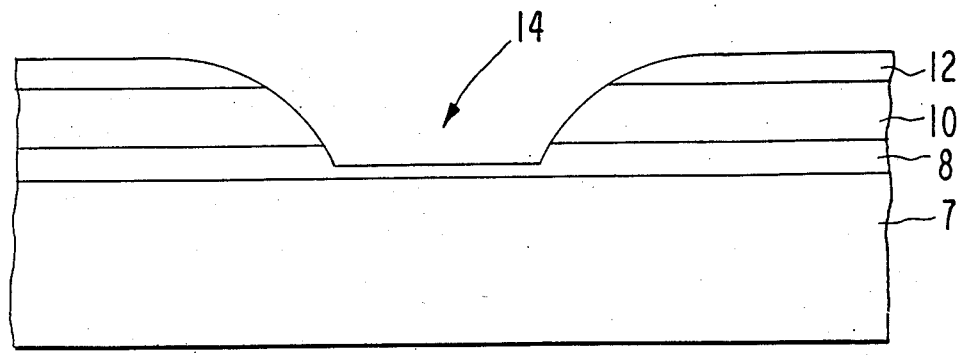
Figure 3D:
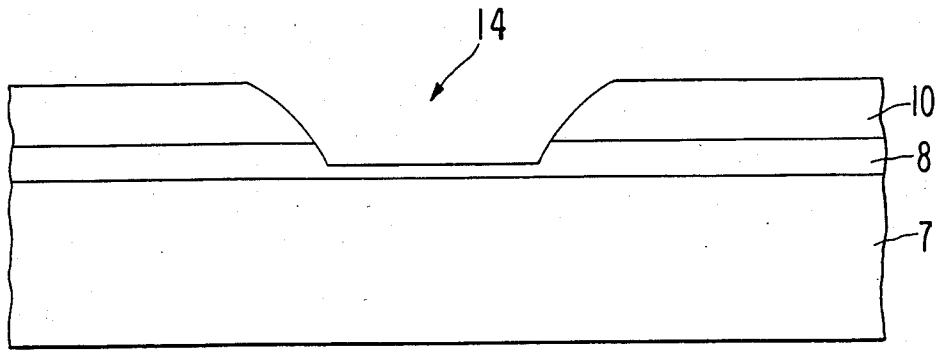

As shown in FIG. 3c, the structure is then subjected to a nonselective RIE process, for example using a plasma composed of approximately 50 cc/min $CHF_3$ and 50 cc/min $O_2$. (Step F of FIG. 5.) The structure in FIG. 3b is subjected to this nonselective etch for a period long enough so that the remaining portion of silicon dioxide layer 8 above substate 1 at window 14 is approximately 850 Å thick. The thickness of the remaining thin layer of silicon dioxide layer 8 is monitored using a system such as the one described in copending U.S. application Ser. No. 06/686,128 filed on Dec. 26, 1984, assigned to the assignee of this Application, which is hereby incorporated by reference. In other embodiments of the invention, the thickness of silicon dioxide layer 8 is monitored by using interferometry or other techniques. The thickness of layer 8 is monitored in order to ensure close tolerances of this thickness. Photoresist layer 12 is then completely removed as shown in FIG. 3d using techniques well known in the art, e.g. using a barrel plasma etching process or a wet chemical strip process. (Step G of FIG. 5.)

Figure 3E:
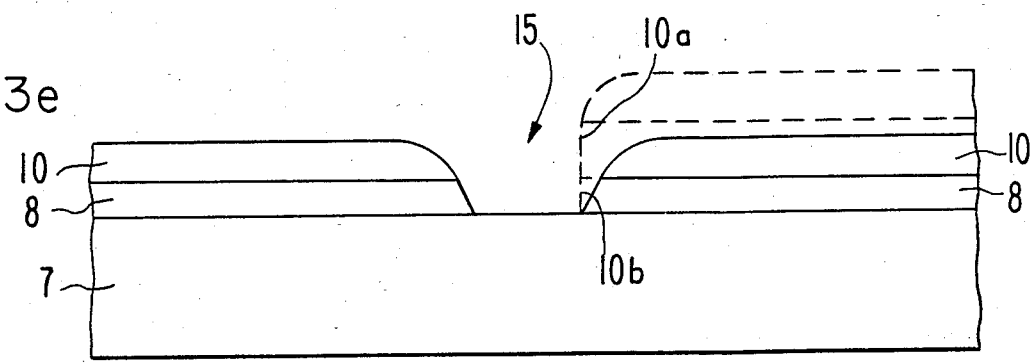

As shown in FIG. 3e, the structure is then subjected to a selective RIE process, as described above, to remove the remaining 850 Å thick layer of silicon dioxide layer 8. (Step H of FIG. 5.) Of importance, without the presence of a photoresist edge, which would serve as an effective mask during this step and cause the anisotropic etch to form a vertical edge in silicon dioxide layers 8 and 10, the etch will approximately replicate the sloped walls of the silicon dioxide, even after the surface of silicon 7 has been cleared of silicon dioxide in the contact area. This etching step also removes up to 4000 Å of silicon dioxide layer 10. Accordingly, the portions of layer 10 previously covered by photoresist becomes thinner during the RIE process. Also of importance, because there is substantially no oxygen used during step H, silicon substrate 7 is not etched during this process.

In an alternative embodiment, photoresist layer 12 is completely removed during the nonselective etch of step F instead of during a separate etch step G. Then, RIE step H is performed.

The reason for performing step E described above is to make silicon dioxide layer 10 under window 14 thinner than the other portions of silicon dioxide layer 10. This makes it possible to subject the entire silicon dioxide layer 10 to the RIE process of step H and remove the layer of silicon dixode in window 14 without inadvertently completely etching away other portions of silicon dioxide layer 10. In this way an electrical contact is formed in window area 14 without inadvertently forming an undesired contact on another portion of the wafer. It is possible to use this process without the initial thinning done in step E, although that would increase the probability of creating short circuits because of excessive etching of silicon dioxide layer 10.

The areas shown by dotted lines in FIG. 3e represent the form that dielectric layer 10 would have had if photoresist layer 12 remained in place during etching step H. Corner 10a of silicon dioxide layer 10 at the upper edge of contact 15 shown by the dotted lines, if present, would be a sharper corner than the one achieved with the process of the present invention. In addition, corner 10b at the lower edge of the contact 15 if present, would also be sharper then the corresponding corner achieved with the process of this invention. Also, the wall of silicon dioxide layer 10 would be essentially vertical if photoresist layer 12 remained in place during etching step H.

Figure 4:
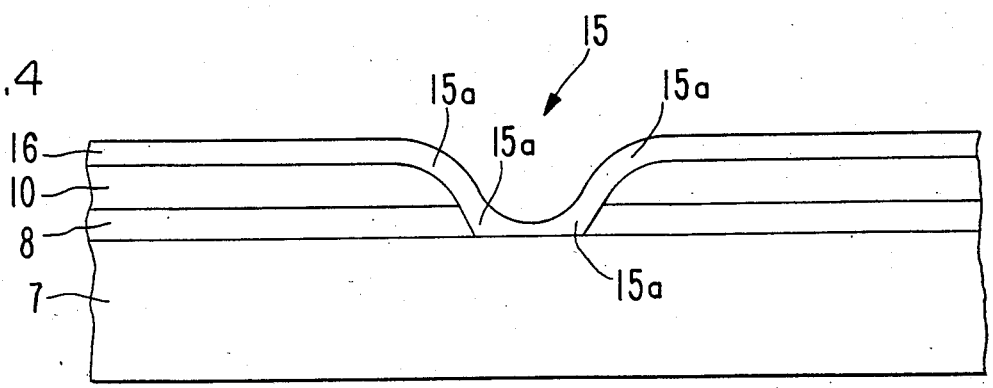
FIG. 4 is a cross-sectional diagram of a contact formed using methods in accordance with the present invention.

FIG. 4 is a cross-section illustration of contact opening 15 with conductor 16 formed on the surface of silicon dioxide layer 10 and extending into contact opening 15. Conductor 16 is formed, for example, by sputtering aluminum or an alloy thereof onto the device, as is well known in the art. (Step I of FIG. 5.) In other embodiments, conductor 16 is a layer of polycrystalline silicon, deposited, for example, by a low pressure CVD process. The rounded corners of contact opening 15 allow a thicker area of conductor 16 to be formed at the corners of contact opening 15 collectively indicated by the number 15a. Because areas 15a of conductor 16 are thicker than prior art contacts, the problems of fusing, misformation of the conductor, corrosion, metal migration, and thermal stress at the corners of the contact are minimized. In one embodiment of the invention, the aluminum is sputtered to a thickness of 7500 Å, and the contact is 2 mircons wide.

While this specification illustrates specific embodiments of this invention, it is not to be interpreted as limiting the scope of the invention. Other embodiments of this invention will become apparent to those of ordinary skill in the art in light of the teachings of this specification.

I claim:

1. A method of forming a contact through first material to material subjacent to said first material comprising the steps of:
    forming a mask above said first material, said mask including a window region;
    etching a first portion of said first material within said window region, a second portion of said first material remaining in said window region after said step of etching said first portion of said first material;
    removing said mask; and
    etching through said second portion of said first material to said subjacent layer.

2. The method of claim 1 wherein after said step of etching a first portion, the walls of said first material surrounding said window region are sloped, said step of removing said mask permitting said walls of said first material to remain sloped after said step of etching through said second portion.

3. The method of claim 1 wherein said mask is a photolithographic mask.

4. The method of claim 1 wherein said first material is silicon dioxide.

5. The method of claim 1 wherein said step of etching said first portion of said first material and said step of etching through said second portion are performed by reactive ion etching.

6. The method of claim 1 wherein said subjacent material is semiconductor material.

7. The method of claim 6 wherein said semiconductor material is silicon.

8. The method of claim 5 wherein the upper edges of said contact are rounded after said step of etching through said second portion.

9. The method of claim 5 wherein the lower edges of said contact are rounded after said step of etching through said second portion.

10. The method of claim 5 wherein the step of etching said first portion of said first material is done with an $O_2$ and $CHF_3$ mixture process gas.

11. The method of claim 10 wherein said step of etching through said second portion is done using a $CHF_3$ process gas with substantially no oxygen present.

12. The method of claim 10 wherein during said step of etching said first portion of said first material, the wall of said mask is eroded.

13. The method of claim 12 wherein prior to said step of etching said first portion of said first material, said first material in said window region is subjected to an etching process that does not erode said wall of said mask.

14. The method of claim 1 wherein said first material comprises a layer of intrinsic $SiO_2$ covered with a layer of $SiO_2$ doped with boron and phosphorus.

15. A method of forming a contact through first material to material subjacent to said first material comprising the steps of:
    forming a mask above said first material, said mask including a window region;
    etching a first portion of said first material within said window region, a second portion of said first material remaining in said window region after said step of etching said first portion, said mask being completely etched away during said step of etching said first portion; and
    etching through said second portion of said first material to said subjacent layer.

16. The process of claim 15 wherein said step of etching a first portion and said step of etching through said second portion are performed by reactive ion etching.

* * * * *